US006825409B2

(12) United States Patent
Haussler et al.

(10) Patent No.: US 6,825,409 B2
(45) Date of Patent: Nov. 30, 2004

(54) METHOD FOR PRODUCING SOLAR CELLS AND THIN-FILM SOLAR CELL

(75) Inventors: Wulf Haussler, Julich (DE); Nikolas Janke, Herzogenrath (DE); Jurgen Schutt, Aachen (DE)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 09/890,864

(22) PCT Filed: Nov. 29, 2000

(86) PCT No.: PCT/FR00/03327
§ 371 (c)(1),
(2), (4) Date: Dec. 21, 2001

(87) PCT Pub. No.: WO01/43204
PCT Pub. Date: Jun. 14, 2001

(65) Prior Publication Data
US 2002/0179143 A1 Dec. 5, 2002

(30) Foreign Application Priority Data
Dec. 7, 1999 (DE) .......................................... 199 58 878

(51) Int. Cl.$^7$ ...................... H01L 31/00; H01L 31/0272
(52) U.S. Cl. ...................... 136/265; 136/256; 136/264; 438/72; 438/84; 438/95
(58) Field of Search ................................. 136/255, 256, 136/259, 264, 265; 438/57, 72, 84, 95, 98

(56) References Cited

U.S. PATENT DOCUMENTS

| | | | | |
|---|---|---|---|---|
| 4,207,119 A | * | 6/1980 | Tyan ............................ | 136/258 |
| 4,663,495 A | * | 5/1987 | Berman et al. .............. | 136/248 |
| RE33,208 E | * | 5/1990 | Yamazaki .................... | 136/244 |
| 4,940,495 A | * | 7/1990 | Weber et al. ................ | 136/256 |
| 5,078,804 A | * | 1/1992 | Chen et al. .................. | 136/260 |
| 5,176,758 A | * | 1/1993 | Nath et al. ................... | 136/251 |
| 5,220,181 A | * | 6/1993 | Kanai et al. .................. | 257/40 |
| 6,071,753 A | * | 6/2000 | Arimoto ....................... | 438/57 |

FOREIGN PATENT DOCUMENTS

EP 0 252 489 1/1988

EP 0 372 929 6/1990

OTHER PUBLICATIONS

Schaffer et al., The Science and Design of Engineering Materials (1995) pp. 40–41.*

Tjhen et al., "Properties of Piezoelectric Thin Films for Micromechanical Devices and Systems," MEMS 1991 Proceedings, IEEE, (1991) pp. 114–119.*

Kirk–Othmer Encyclopedia of Chemical Technology, Physical properties of zinc oxide and pure copper.*

A. M. Hermann, et al., Solar Energy Materials and Solar Cells, vol. 52, No. 3–4, pp. 355–360, "Low–Cost Deposition of CuInSe2 (CIS) Films for CdS/CIS Solar Cells", Apr. 30, 1998.

K. Kushiya, et al., Japanese Journal of Applied Physics, vol. 38, No. 7A, pp. 3997–4001, "Application of Stacked ZnO Films as a Window Layer to Cu(INGA) SE2–Based Thin–Film Modules", Jul. 1999.

W. E. Devaney, et al., Record of the Photovoltaic Speclialists Conference, vol. Conf. 21, pp. 535–540, "4–CM2 Cuingase2 Based Solar Cells", May 21, 1990.

K. Kushiya, et al., Commission of the European Communities, E. C. Photovoltaic Solar Energy Conference, Proceedings of the International Conference, (the whole document), "Development of Cu(InGa)Se2 Thin–Film Solar Cells with Zn–Compound Buffer", Oct. 23, 1995.

* cited by examiner

Primary Examiner—Nam Nguyen
Assistant Examiner—Brian L Mutschler
(74) Attorney, Agent, or Firm—Oblon, Spivak, McClelland, Maier & Neustadt, P.C.

(57) ABSTRACT

A thin-film solar cell and a method of producing a thin-film solar cell. The thin-film solar cell includes an absorber layer and at least one transparent window electrode. The window electrode is produced with a first metal-based thin-film, which receives an anti-reflection treatment, at least on the side of which the light is incident. Further, at least one first highly light-refracting oxide or nitride layer is provided between the absorbent layer and the first metallic layer. As a result, conductivity of the electrode window is improved and, at the same time, a thickness compared to conductivity of the window electrode is reduced.

27 Claims, No Drawings

METHOD FOR PRODUCING SOLAR CELLS AND THIN-FILM SOLAR CELL

BACKGROUND OF THE INVENTION

1. Field of the Invention

The invention relates to thin-film solar cells, as well as to a process for the manufacture of thin-film solar cells.

2. Discussion of the Background

It is known that photovoltaic solar cells built on a support comprise a front or window electrode, an absorber layer and a rear electrode. In general, and in what follows, the electrode through whose plane the light to be converted to voltage or electrical power respectively penetrates into the absorber layer is referred to as the window electrode. The window electrode must therefore be as transparent as possible or must have high light transmission, in order that it does not needlessly reduce the efficiency of the solar cell. On the other hand, the rear electrode provided on the other face of the absorber layer can be relatively thick and opaque. It must be characterized substantially by the lowest possible surface electrical resistance and good adherence to the absorber layer and, as the case may be, to the underlying layer. In most cases, the rear electrodes are manufactured from molybdenum metal, which satisfies the foregoing conditions.

In the most widely used type of thin-film solar cells, the rear electrode is disposed between a support, the underlying layer, and the absorber layer; the transparent window electrode is disposed on the cell face situated opposite the underlying layer. Consequently, the underlying layer likewise does not necessarily have to be transparent. It can be made of glass, ceramic, polymer films or even of metallic sheets.

In solar cells with an overlying layer, the window electrode is disposed between the support, which in this case must also be highly transparent and, as the case may be, poorly reflecting antireflective, and the absorber layer, such that the light reaches the absorber layer through the support and the window electrode. In this case, the rear electrode situated opposite the support does not have to be transparent.

The absorber layer is most often made of a layer of chalcopyrite with additions of copper, indium and selenium (known as CIS absorber layers), sometimes also with sulfur instead of selenium. Occasionally the absorber layer is also doped with gallium (CIGS absorber layers). The absorber layer generally exhibits p-type conduction. To manufacture a pn junction, a buffer layer of material having n-type conduction is applied in a thickness of less than 100 nm on the absorber layer having p-type conduction. It is known from U.S. Pat. No. 4,611,091 that cadmium sulfide (CdS) can be used as material for the buffer layer, with a conductive window of ZnO placed thereabove.

If zinc oxide (ZnO) or another transparent oxide is used as material for the window electrode, this material, which is dielectric in itself, must be deposited as a doped semiconductor. The conductivity is achieved by doping, with aluminum or boron among other substances. On the industrial scale, these window electrodes are most often deposited by sputtering (cathodic sputtering under a magnetic field) on the surface of the absorber layer. However, layers with a thickness of 400 nm and more then are needed in order to limit the surface resistance to a usable level. Consequently, however, the light transmission is reduced compared with thinner layers. Another drawback of this process is that the sputtering parameters, in particular the oxygen partial pressure in the reactive atmosphere of the sputtering chamber, can be variably adjusted only in a very narrow range in order to obtain optimal results. Finally, the deposition of relatively thick ZnO layers is also time-consuming and costly because of a relatively low rate of coating with zinc metal in a reactive atmosphere. As an alternative technique there can be used ceramic targets, which are already composed of the desired conductive zinc oxide. Nevertheless, there is no advantage as regards deposition rate.

It is certainly possible to produce a ZnO window electrode with results that are also still usable from the optical viewpoint, by chemical vapor deposition (CVD), but even thicker layers up to 1500 nm must be tolerated in order to obtain satisfactory conductivity by this process, because the material density of the layers produced in this way is inferior to that of layers deposited by sputtering.

It has also been observed that a relatively thin layer (such as 100 nm) of dielectric ZnO between the absorber layer and the window layer of ZnO made conductive by doping increases the efficiency of the solar cell, and that it also has a positive influence on the stability of the process.

An advantage of this configuration, however, is that the known solar cells with CIS absorber layers have an open-circuit potential which depends on a difference of charge between the absorber layer with p-type conduction and the ZnO electrode made conductive by doping (with n-type conduction).

SUMMARY OF THE INVENTION

The object of the invention is to provide a process for the economic manufacture of solar cells with an improved window electrode and to propose thin-film solar cells equipped with such window electrodes.

Thus the window electrode can be manufactured with a thin metal-base layer, which is treated to be antireflective by at least one highly refractive oxide or nitride layer at least on the side on which light is incident.

With the use of a metallic layer or of a metal-base layer respectively, the conductivity of the window electrode is generally increased. With the antireflective treatment at least on the side of the metallic layer on which light enters (or in other words on its surface opposite the absorber layer), it is ensured that the usable light also passes effectively through the electrode and is not reflected for the most part or at all at the surface of the metallic layer.

In principle, it is of little importance whether or not the antireflective layer itself is electrically conductive. It may be deposited in a single layer or in a succession of layers, with the only limitations that, on the one hand, it must be sufficiently transparent and, on the other hand, it must adhere well to the metallic layer and be chemically compatible therewith.

According to one embodiment of the invention, at least one of the dielectric layers is composed of zinc oxide.

According to the invention, the metallic layer is composed of silver or silver alloy and the antireflective layer is a highly refractive oxide or nitride layer.

In one modification, a highly refractive layer or succession of such layers is also disposed between the absorber layer and the metallic layer of the window electrode. In principle, it is also of little importance whether or not this is electrically conductive, bearing in mind that it must in no case substantially limit the flow of current between the absorber layer and the window electrode by its ohmic resistance.

In a particularly preferred embodiment, the window electrode is produced in the form of a succession of layers comprising a dielectric layer, a base layer of metal or alloy and another dielectric layer.

Without departing from the scope of the invention, the window electrode can comprise successively a first highly refractive layer, a first metallic layer, a second highly refractive layer, a second metallic layer and the antireflective layer.

The highly refractive and possibly dielectric layers can be deposited in known manner in the form of oxides (ZnO, $SnO_2$, $BiO_x$, $TiO_2$, $Al_2O_3$) or nitrides (AlN, $Si_3N_4$). The metallic layer is preferably composed of elements or alloys having high conductivity, such as Ag, Cu, Au, Al or alloys thereof.

The solar cell according to the invention can also comprise at least one metallic layer and one highly refractive oxide or nitride layer.

In a particular embodiment, the metallic layer of the window electrode, particularly a silver layer, has a thickness of less than 20 nm, and the total thickness of the window electrode is less than 120 nm.

To protect the already terminated conductive thin layer from oxidation during the deposition of a highly refractive or respectively dielectric layer, it may be possible to provide a blocking layer based, for example, on NiCr, Ti, Al or Pb between the metal-base layer and the highly refractive or respectively dielectric layer to be deposited thereafter.

In principle, successions of layers comprising two dielectric layers with an intermediate metallic layer (functional layer) are generally known as thermal insulation layers for reduction of the emissivity of glazing units of buildings or automobiles. The dielectric layers therein act as antireflective treatments of the intermediate metallic layer by virtue of the difference in refractive index. Without the dielectric layers, the metal-base layer would also reflect too much of the visible light, and this is in no case desirable for automobile glazing units.

It is also known that a relationship exists between the electrical conductivity and the thermal insulation effect of the functional layer, such that its infrared reflection is also high when the conductivity is high.

The use of such successions of layers that are already widely employed and manufactured in large dimensions as window electrodes on the one hand offers the advantage of clearly more economical manufacture compared with the conventional ZnO window electrodes, and on the other hand the total thicknesses of these layers can be appreciably reduced by virtue of the clearly lower surface resistance, of a metallic silver layer, for example, compared with the 400 nm of ZnO necessary heretofore.

The window element according to the invention can therefore comprise a succession of a first highly refractive layer, a first metallic layer and a second highly refractive layer.

Thus the necessary surface resistance of $R_\square<10\Omega_\square$ can be obtained with a silver layer having a thickness of less than 20 nm, disposed between two dielectric layers having thicknesses of about 30 to 50 nm. In this way a window electrode having a thickness of less than 120 nm can therefore be achieved.

Without departing from the scope of the invention, the window element can also comprise the succession just described, to which there is added a second metallic layer and the antireflective layer. In this stack of five layers, the metallic layer can be composed of silver or a silver alloy.

The window electrode according to the invention can be used not only with CIS thin-film solar cells, but also for solar cells produced by other thin-film technologies in models containing underlying layer or overlying layer. Solar cells with amorphous silicon or with cadmium telluride as absorber layer can also be equipped with the window electrode discussed here. In another conceivable embodiment, the two electrode layers of a thin-film solar cell can be replaced by the transparent electrode according to the invention.

It is also possible to produce a combination of the electrode containing a metallic layer with a thin layer of conductive oxide, interposed between the absorber and the metallic layer.

To produce an example, there was deposited on a CIS thin-film solar cell having glass/Mo/CIS/CdS structure a window electrode having the following structure:

| dielectric 1 | ZnO | about 50 nm |
| blocking | Ti | about 3 nm |
| metal | Ag | about 15 nm |
| dielectric 2 | ZnO | about 55 nm |
| | $Si_3N_4$ | about 30 nm | in which the silicon nitride layer acts substantially as mechanical protection against damage (scratches). An additional effect may be the decrease of diffusion of moisture into the absorber layer, which reduces the storage stability of unshielded solar cells and respectively the climatic stability of stratified solar modules.

For a layer of this nature deposited on glass, there has been determined a surface resistance of $R_\square=8.5\Omega_\square$. On a solar cell provided with this layer, there was measured a reflection ratio of 1.2% in the region of the visible spectrum. Compared with conventional window electrodes, which have a reflection ratio of about 8%, this layer structure therefore has a reflection-reducing effect, and it therefore imparts improved light transmission in the absorber layer.

The specimen was divided into four solar cells, on each of which a metallic contact was formed by vapor deposition. For reference purposes, ZnO:Al made conductive by aluminum doping was deposited as the window electrode on a solar cell having the same structure.

The following characteristic values were measured on these solar cells:

| | Open-circuit voltage $U_{oc}$ [mV] | Short-circuit current $I_{sc}$ [mA/cm$^2$] | Fill factor FF [%] | Efficiency $\eta$ [%] |
| --- | --- | --- | --- | --- |
| Cell 1 | 522 | 24.1 | 66.5 | 8.4 |
| Cell 2 | 535 | 23.9 | 66.6 | 8.5 |
| Cell 3 | 517 | 24.8 | 66.3 | 8.5 |
| Cell 4 | 509 | 24.8 | 64.9 | 8.2 |
| Reference | 610 | 31 | 77 | 14.6 |

Certainly the values of cells 1 to 4 are poorer than the comparison values measured with the reference cell, but for the first time proof has been found of the applicability of the principle of the sandwich window electrode. It is hoped that even better values can also be achieved by adequate optimization of the deposition process and of the layer thicknesses.

The comparatively low efficiency of solar cells containing the window electrode according to the invention is explained by the fact that the wavelength region in which the window electrode is transparent (300 nm to 900 nm) is narrower than the region of high spectral sensitivity of the absorber layer (about 300 nm to 1300 nm). In this specific case, the usable quantity of incident light in the wavelength region between about 900 nm and 1300 nm is therefore reflected by the window electrode.

Results comparable to those of the reference specimen can be expected when the region of high transmission of the window electrode has been better adapted to the spectral sensitivity of the absorber, or in other words after it is possible for the window electrode also to be transparent for wavelengths longer than 900 nm up to about 1300 nm. Possibilities for lowering the upper reflection threshold by influencing the conductivity of the metallic layer are well known to those skilled in the art. The conductivity of the metallic layer decreases, however, when its transparency for longer wavelengths is increased.

What is claimed is:

1. A thin-film solar cell comprising:
    an absorber layer;
    at least one transparent window electrode disposed on a side on which light is incident, said window electrode comprising at least a first metallic layer and at least a first antireflective layer deposited on the side on which light is incident, situated opposite the absorber layer; and
    a plurality of refractive layers between the absorber layer and the metallic layer of the window electrode, said plurality of refractive layers each composed of a non-conductive oxide or nitride.

2. A thin-film solar cell according to claim 1, wherein at least one of said plurality of refractive layers is composed of non-doped zinc oxide.

3. A thin-film solar cell according to claim 1, wherein said first metallic layer includes silver or silver alloy and said first antireflective layer is a refractive oxide or nitride layer.

4. A thin-film solar cell according to claim 1, wherein the window electrode is formed by a succession of layers comprising said plurality of refractive layers, said first metallic layer, another refractive layer, and said first antireflective layer.

5. A thin-film solar cell according to claim 1, wherein the window electrode comprises in succession said plurality of refractive layers, said first metallic layer, another refractive layer, a second metallic layer, and said first antireflective layer.

6. A thin-film solar cell according to claim 1, wherein each of said plurality of refractive layers are composed of one of the oxides ZnO, $SnO_2$, $BiO_x$, $TiO_2$, $Al_2O_3$ and/or one of the nitrides AlN, $Si_3N_4$.

7. A thin-film solar cell according to claim 1, further comprising a second electrode including at least one metallic layer and one refractive oxide or nitride layer.

8. A thin-film solar cell according to claim 1, wherein the metallic layer of the window electrode has a thickness of less than 20 nm, and a total thickness of the window electrode is less than 120 nm.

9. A thin-film solar cell according to claim 1, further comprising a blocking layer disposed between the metallic layer and said plurality of refractive layers.

10. A thin-film solar-cell according to claim 3, wherein said plurality of refractive layers comprises a layer of refractive oxide covered by a layer of nitride.

11. A thin-film solar cell according to claim 1, wherein the absorber layer comprises a CIS structure.

12. A process for manufacturing a thin-film solar cell comprising:
    providing an absorber layer and at least one transparent window electrode dispersed on a side on which light is incident, said window electrode comprising at least a first metallic layer and at least a first antireflective layer applied on the side on which light is incident; and
    forming a plurality of refractive layers between the absorber layer and the metallic layer of the window electrode, said plurality of refractive layers composed of non-conductive oxide or nitride.

13. A process according to claim 12, wherein the window electrode is formed by a succession of layers comprising said plurality of refractive layers, said first metallic layer, another refractive layer, and said first antireflective layer.

14. A process according to claim 12, wherein the window electrode is formed by a succession of said plurality of refractive layers, said first metallic layer, another refractive layer, a second metallic layer, and said first antireflective layer.

15. A process according to claim 12, further comprising forming a second electrode by applying at least one other metallic layer and one other refractive oxide or nitride layer.

16. A process according to claim 12, wherein the absorber layer comprises chalcopyrite.

17. A thin-film solar cell comprising:
    an absorber layer;
    at least one transparent window electrode disposed on a side on which light is incident, said window electrode comprising at least a first metallic layer and at least a first antireflective layer deposited on the side on which light is incident, situated opposite the absorber layer; and
    a plurality of refractive layers between the absorber layer and the metallic layer of the window electrode, at least one of said plurality of refractive layers composed of non-conductive oxide or nitride and having a thickness of about 30 to about 55 nm.

18. A thin-film solar cell according to claim 17, wherein at least one of said plurality of refractive layers includes non-doped zinc oxide.

19. A thin-film solar cell according to claim 17, wherein the metallic layer includes silver or silver alloy and the antireflective layer is a refractive oxide or nitride layer.

20. A thin-film solar cell according to claim 17, wherein the window electrode is formed by a succession of layers comprising said plurality of refractive layers, said first metallic layer, another refractive layer, and said first antireflective layer.

21. A thin-film solar cell according to claim 17, wherein the window electrode comprises in succession said plurality of refractive layers, said first metallic layer, a second refractive layer, a second metallic layer, and said first antireflective layer.

22. A thin-film solar cell according to claim 17, wherein each of said plurality of refractive layers includes one of the oxides ZnO, $SnO_2$, $BiO_x$, $TiO_2$, $Al_2O_3$ and/or one of the nitrides AlN, $Si_3N_4$.

23. A thin-film solar cell according to claim 17, further comprising a second electrode including at least one metallic layer and one refractive oxide or nitride layer.

24. A thin-film solar cell according to claim 17, wherein the metallic layer of the window electrode has a thickness of less than 20 nm, and a total thickness of the window electrode is less than 120 nm.

25. A thin-film solar cell according to claim 17, further comprising a blocking layer disposed between the metallic layer and said plurality of refractive layers.

26. A thin-film solar-cell according to claim 19, wherein said plurality of refractive layers comprises a layer of refractive oxide covered by a layer of nitride.

27. A thin-film solar cell according to claim 17, wherein the absorber layer comprises a CIS structure.

* * * * *